(12) United States Patent
Son et al.

(10) Patent No.: US 9,574,095 B2
(45) Date of Patent: Feb. 21, 2017

(54) COMPOSITION FOR PRINTING AND PRINTING METHOD USING THE SAME

(75) Inventors: Yong Goo Son, Daejeon (KR); Ji Young Hwang, Daejeon (KR); Beom Mo Koo, Daejeon (KR); In-Seok Hwang, Daejeon (KR); Seung Heon Lee, Daejeon (KR); Sang Ki Chun, Daejeon (KR); Jiehyun Seong, Daejeon (KR); Joo Yeon Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 530 days.

(21) Appl. No.: 14/009,756

(22) PCT Filed: Apr. 5, 2012

(86) PCT No.: PCT/KR2012/002561
§ 371 (c)(1),
(2), (4) Date: Jan. 17, 2014

(87) PCT Pub. No.: WO2012/138138
PCT Pub. Date: Oct. 11, 2012

(65) Prior Publication Data
US 2014/0127408 A1 May 8, 2014

(30) Foreign Application Priority Data
Apr. 5, 2011 (KR) .................. 10-2011-0031367

(51) Int. Cl.
*B41M 3/00* (2006.01)
*C09D 11/102* (2014.01)
(Continued)

(52) U.S. Cl.
CPC .............. *C09D 11/102* (2013.01); *B41M 1/06* (2013.01); *B41M 3/00* (2013.01); *C09D 7/001* (2013.01);
(Continued)

(58) Field of Classification Search
CPC .............................. C09D 7/001; C09D 11/033
See application file for complete search history.

(56) References Cited

U.S. PATENT DOCUMENTS

2008/0241414 A1    10/2008   Kim et al.
2009/0081379 A1     3/2009   Nawrocki et al.
(Continued)

FOREIGN PATENT DOCUMENTS

JP        2005126608 A    5/2005
JP        2006037057 A    2/2006
(Continued)

*Primary Examiner* — Xiao Zhao
(74) *Attorney, Agent, or Firm* — Dentons US LLP

(57) ABSTRACT

Provided are a composition for printing for use in a printing method which uses a silicon-based blanket, including: 1) a binder resin, 2) a low boiling point solvent having a boiling point of less than 100° C., 3) a medium boiling point solvent having a boiling point of 100° C. or more and less than 180° C., and 4) a high boiling point solvent having a boiling point of 180° C. or more, wherein the medium boiling point solvent and the high-boiling solvent have a difference in solubility parameter with the binder resin of 3 $(cal \cdot cm)^{1/2}$ or less, a difference in solubility parameter with the silicon-based blanket of 4 $(cal \cdot cm)^{1/2}$ or more, and a swelling parameter for the silicon-based blanket of 2 or less, and a printing method using the same.

21 Claims, 1 Drawing Sheet

(51) Int. Cl.
   *C09D 7/00*      (2006.01)
   *C09D 11/033*    (2014.01)
   *B41M 1/06*      (2006.01)
   *C09D 11/103*    (2014.01)
   *H05K 3/00*      (2006.01)
   *H05K 3/06*      (2006.01)

(52) U.S. Cl.
   CPC ........... *C09D 11/033* (2013.01); *C09D 11/103* (2013.01); *H05K 3/0076* (2013.01); *H05K 3/0079* (2013.01); *H05K 3/061* (2013.01)

(56) References Cited

U.S. PATENT DOCUMENTS

2009/0247652 A1* 10/2009 Silverman ............ B01J 13/0047
                                                          516/33
2011/0244196 A1   10/2011 Kim et al.
2011/0267409 A1   11/2011 Nawrocki et al.
2012/0207918 A1    8/2012 Seong et al.

FOREIGN PATENT DOCUMENTS

| JP | 2006037058 A  |  2/2006 |
| JP | 2006037059 A  |  2/2006 |
| JP | 2006037060 A  |  2/2006 |
| JP | 2007177201 A  |  7/2007 |
| JP | 2008050398 A  |  3/2008 |
| JP | 2010540695 A  | 12/2010 |
| KR | 1020080088712 A | 10/2008 |
| KR | 1020090046010 A |  5/2009 |
| KR | 1020110023776 A |  3/2011 |

* cited by examiner

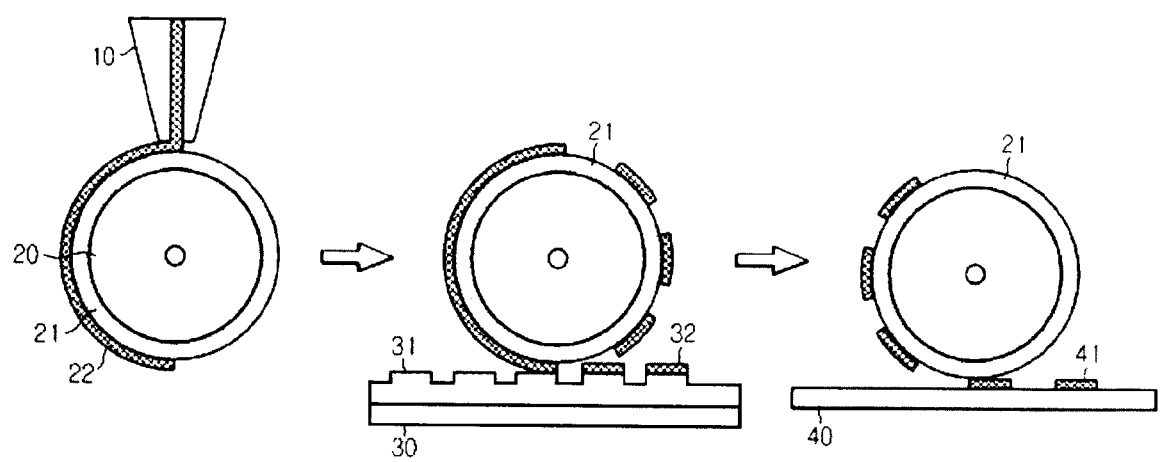

COMPOSITION FOR PRINTING AND PRINTING METHOD USING THE SAME

This application is a national stage application of International Application No. PCT/KR2012/002561, filed on Apr. 5, 2012, which claims priority to and the benefit of Korean Patent Application No. 10-2011-0031367, filed in the Korean Intellectual Property Office on Apr. 5, 2011, the entire contents of which are incorporated herein by reference.

TECHNICAL FIELD

This application relates to a composition for printing and a printing method using the same. Specifically, this application relates to a composition for reverse offset printing, capable of forming a fine pattern and a printing method using the same. More specifically, this application relates to a composition for reverse offset printing, which uses a silicon-based blanket, in particular, a resist composition, and a printing method using the same.

BACKGROUND ART

Recently, as the performance of electronic devices such as touch screens, displays, semiconductors, and the like has been diversified and highly developed, it is necessary to use materials having various functions to form a pattern, and the need for further finely forming the line width and line spacing of the pattern is increasing.

For example, conductive patterns for forming electrodes in various electronic devices, resist patterns for forming a black matrix of a color filter or a conductive pattern, and the like have been used in many cases, and as electronic devices are miniaturized and their performance is highly developed, it is necessary to form these patterns further finely.

Methods for forming a pattern are diversified according to the use, and representative examples thereof include a photolithography method, a screen printing method, an inkjet method, and the like.

The photolithography method is a method which may form a photosensitive layer with a photosensitive material and selectively expose and develop the photosensitive layer for patterning to form a pattern.

However, the photolithography method causes an increase in process costs due to costs of photosensitive materials, which are not included in a final product and are developed and removed, and an etchant and disposal costs of the photosensitive materials and the etchant. Further, there is a problem of environmental pollution caused by disposal of the materials. In addition, the method has many processes and is complicated, and thus much time and costs are required.

The screen printing method is carried out by using ink based on conductive particles having a size ranging from several hundred nanometers to several ten micrometers for screen printing and then performing sintering.

The screen printing method and the inkjet method have limitations in implementing a fine pattern having a size of several ten micrometers.

DISCLOSURE

Technical Problem

The present invention has been made in an effort to provide a reverse offset printing composition that can implement a fine pattern and improve uniformity of a coat and a printing process margin through a reverse offset printing process using a silicon-based blanket, and a printing method using the same.

Technical Solution

An exemplary embodiment of the present invention provides a reverse offset printing composition using a silicon-based blanket, including: 1) a binder resin, 2) a low boiling point solvent having a boiling point of less than 100° C., 3) a medium boiling point solvent having a boiling point of 100° C. or more and less than 180° C., and 4) a high boiling point solvent having a boiling point of 180° C. or more, wherein the low boiling point solvent and the high boiling point solvent have a solubility parameter difference of 3 (cal·cm)$^{1/2}$ or less to the binder resin and 4 (cal·cm)$^{1/2}$ or more to the silicon-based blanket, and a swelling parameter of 2 or less to the silicon-based blanket.

Another exemplary embodiment of the present invention provides a printing method using a reverse offset printing composition using a silicon-based blanket. Specifically, the printing method includes applying the printing composition on a silicon-based blanket; bringing a cliche into contact with a printing composition coat applied on the silicon-based blanket to remove a portion of the coat; and transferring the printing composition coat remaining on the silicon-based blanket on a printing subject.

Advantageous Effects

A printing composition according to the present invention is a matter that is optimized so as to be suitably used for particularly a reverse offset printing method using a silicon-based blanket, and it is possible to minimize a swelling phenomenon of the blanket even though the number of printing is repeated, improve printing processability, and precisely implement a pattern having a fine line width and line interval by controlling a solvent in the printing composition so as to have a predetermined physical property in relationship with a binder resin and the silicon-based blanket used during the printing process. Further, it is possible to improve uniformity of a coat obtained by printing and a printing process margin.

BRIEF DESCRIPTION OF THE DRAWINGS

FIG. 1 illustrates a process mimetic diagram of a reverse offset printing method.

MODE FOR INVENTION

Hereinafter, the present invention will be described in more detail.

A printing composition according to the present invention is a matter for being applied to reverse offset printing using a silicon-based blanket, and includes 1) a binder resin, 2) a low boiling point solvent having a boiling point of less than 100° C., 3) a medium boiling point solvent having a boiling point of 100° C. or more and less than 180° C., and 4) a high boiling point solvent having a boiling point of 180° C. or more, wherein the low boiling point solvent and the high boiling point solvent have a solubility parameter difference of 3 (cal·cm)$^{1/2}$ or less to the binder resin and 4 (cal·cm)$^{1/2}$ or more to the silicon-based blanket, and a swelling parameter of 2 or less to the silicon-based blanket.

The present inventors have found that a composition for printing for use in a reverse offset printing method using a blanket formed of a silicon-based material can improve printing processability and implement a fine pattern by considering characteristics of a binder resin included in the composition for printing and the blanket material used in the printing process to select a solvent of the composition for printing, and derived the optimal physical value of the solvent when the silicon-based blanket is used based on this.

Specifically, in an exemplary embodiment of the present invention, a low-boiling point solvent having a boiling point of 100° C. or less, a medium boiling point solvent having a boiling point of 100° C. or more and less than 180° C., and a high-boiling point solvent having a boiling point of 180° C. or more are used together as solvents in the composition for printing. Further, the low-boiling point solvent and the high-boiling point solvent have a difference in solubility parameter with the binder resin of 3 $(cal \cdot cm)^{1/2}$ or less, a difference in solubility parameter with the silicon-based blanket of 4 $(cal \cdot cm)^{1/2}$ or more, and a swelling parameter for the silicon-based blanket of 2 or less.

In an exemplary embodiment of the present invention, a low-boiling point solvent, a medium boiling point solvent and a high-boiling point solvent are used together, and the low-boiling point solvent allows a composition for printing to maintain a low viscosity of the composition for printing and an excellent coatability for a blanket until the composition is coated on the blanket, and may be removed by volatilization to increase the viscosity of the composition for printing and form and maintain a pattern on the blanket well. Meanwhile, the high-boiling point solvent is a solvent which exhibits a relatively low volatility and may impart tackiness to the composition for printing until a pattern is transferred to an object to be printed. The medium boiling point solvent may act while remaining in the printing composition even though the low boiling point solvent is volatilized. In the present invention, viscosity of the printing composition may be more precisely controlled as described above by using three or more kinds of solvents having different boiling points.

In an exemplary embodiment of the present invention, the low-boiling point solvent has a boiling point of preferably 100° C. or less, more preferably 95° C. or less and even more preferably 90° C. or less. By including a low-boiling point solvent having a boiling point within the numerical range, the composition for printing may be coated on the blanket, and then a cliché may be contacted with a coating film of the composition for printing, which is coated on the blanket to reduce the process wait time until a part of the coating film is removed and reduce the swelling of the blanket.

In an exemplary embodiment of the present invention, the low-boiling point solvent has a boiling point of preferably 50° C. or more. When the boiling point of the low-boiling point solvent is too low, a problem that the composition for printing is dried in the nozzle when the composition for printing is coated may occur. In addition, the low-boiling point solvent preferably has a boiling point of 50° C. or more in order to obtain an excellent leveling property immediately after the composition for printing is coated.

The boiling point of the medium boiling point solvent is preferably 100° C. or more and less than 180° C. and more preferably 130 to 170° C. The boiling point of the medium boiling point solvent within the aforementioned range is useful to increase a printing process margin. Specifically, since the medium boiling point solvent is volatilized between a volatilizing time of the low boiling point solvent and a volatilizing time of the high boiling point solvent, stickiness of the printing composition may be maintained to improve the printing process margin by reducing an increase rate of viscosity of the printing composition. For reference, a printing waiting time means a time of application of the printing composition on the blanket to a time before an off process of removing a portion of the coat on the blanket by a cliche, and the printing process margin means a value obtained by subtracting a minimum printing waiting time from a maximum printing waiting time required to favorably form a desired pattern over an entire area. Further, uniformity of the coat of the printing composition may be improved by maintaining viscosity of the medium boiling point solvent even though the low boiling point solvent is volatilized.

A difference between the boiling point of the medium boiling point solvent and the boiling point of each of the low boiling point solvent and the high boiling point solvent is preferably 5° C. or more and more preferably 10° C. or more. If the difference between the boiling points of the solvents is too small, the volatilizing time to the low boiling point solvent or the high boiling point solvent is similar, thus, it is difficult to accomplish an effect according to a role of the medium boiling point of itself. Furthermore, the high-boiling point solvent preferably has a boiling point of 180° C. or more. By including a high-boiling point solvent having a boiling point within the numerical range, tackiness may be imparted to the composition for printing until a pattern is transferred to an object to be printed, a process wait time may be reduced, and the swelling of the blanket may be reduced.

The boiling point of the high-boiling point solvent according to an exemplary embodiment of the present invention may be 300° C. or less and is preferably 250° C. or less. If the high-boiling point solvent has a boiling point of 250° C. or less, a problem that the solvent residue is present in the final printed material to prolong the time for drying or curing may be prevented, and the precision of the printing pattern may also be improved.

In the present invention, the low boiling point solvent and the high boiling point solvent have the solubility parameter difference of 3 $(cal \cdot cm)^{1/2}$ or less to the binder resin and 4 $(cal \cdot cm)^{1/2}$ or more to the silicon-based blanket, and a swelling parameter of 2 or less to the silicon-based blanket. Herein, the solubility parameter is a measure of solubility and was referred to as the Hildebrand solubility parameter.

The low-boiling point solvent and the high-boiling point solvent preferably have a difference in solubility parameter with the binder resin of 3 $(cal \cdot cm)^{1/2}$ or less and more preferably 2 $(cal \cdot cm)^{1/2}$ or less. When the difference in solubility parameter between the high-boiling point solvent and the binder resin is within the numerical range, the solubility of the binder resin to the high-boiling point solvent is high and the compatibility of the solvent with the binder resin is high. Therefore, tackiness may be imparted to a coating film coated on a blanket.

Due to tackiness property of the coating film, the coating film is not easily separated from the blanket, and when a part of the coating film is separated and removed by a cliché, a precise pattern may be realized without any pattern picking at the boundary between a region in which the coating film should be separated and a region in which the coating film should not be separated.

Further, when the difference in solubility parameter of the binder resin is within the range, a problem that the binder may not be dissolved in the solvent may be prevented by the occurrence of the phase separation, and thus a uniform composition for printing may be provided. For this reason, the smaller the difference in solubility parameter between the high-boiling point solvent and the binder resin is, the better.

In addition, the low-boiling point solvent and the high-boiling point solvent have a difference in solubility parameter with the silicon-based blanket of preferably 4 $(cal \cdot cm)^{1/2}$ or more and more preferably 4.5 $(cal \cdot cm)^{1/2}$ or more.

When the difference in solubility parameter of the silicon-based blanket is within the numerical range, the solubility of the silicon-based blanket to the high-boiling point solvent is low, and thus the swelling of the blanket may be minimized and the deformation of the blanket form may be controlled even though the number of printing is repeated. Due to this, the printing process time may be constantly maintained, and the pattern formed may be precisely maintained even though the number of printing is repeated. Furthermore, when the difference is within the range, it is advantageous in that the pattern transfer to the cliché from the blanket is readily performed in the off process in which a part of the coating film of the composition for printing coated on the silicon-based blanket is picked by the cliché. For this reason, the greater the difference in solubility parameter between the high-boiling point solvent and the silicon-based blanket, the better.

Furthermore, the low-boiling point solvent and the high-boiling point solvent preferably have a swelling parameter for the silicon-based blanket of 2 or less. Herein, the swelling parameter is a numerical value which is obtained by measuring the swelling degree of a silicon blanket for a solvent, and is obtained by dipping a silicon-based blanket with an embossed mesh having a line width of 20 micrometers and a distance between lines of 300 micrometers patterned in a solvent for 12 hr and then measuring a change in the distance between lines. The swelling parameter may be represented by the following Equation 1.

Swelling parameter={(distance between lines after dipping−distance between lines before dipping)/(distance between lines before dipping)}×100     [Equation 1]

When the swelling parameter for the silicon-based blanket is within the numerical range, the swelling degree of the silicon-based blanket by means of the high-boiling point solvent is low, and thus the swelling of the blanket may be minimized and the deformation of the blanket form may be controlled so as to be minimized even though the number of printing is repeated. Due to this, the printing process time may be constantly maintained, and the precision of the pattern formed may be excellently maintained even though the number of printing is repeated. For this reason, the smaller the swelling parameter of the high-boiling point solvent for the silicon-based blanket is, the better.

In an exemplary embodiment of the present invention, the numerical ranges with respect to the difference in solubility parameter of the low-boiling point solvent and the high-boiling point solvent to the blanket, and the swelling parameter of the low-boiling point solvent and the high-boiling point solvent for the blanket have a close relationship with materials of the blanket. Accordingly, the numerical range may be suitably applied when the blanket is a silicon-based material.

In an exemplary embodiment of the present invention, tackiness properties and cohesive energy of the composition for printing may be controlled by selecting and using a solvent having specific physical properties in a relationship with the binder resin and the silicon-based blanket as described above. The printing coating film may be thinly and uniformly formed by this, and as described above, a fine pattern may be precisely formed and printing processability may be improved by preventing the deformation of the blanket.

In an exemplary embodiment of the present invention, a printing pattern having a small line height may be formed by the above-described configuration so as to have a uniform line height. In the present invention, the difference of line height of the printing pattern may reach, for example, 10% or less and more preferably 5% or less. In general, it is preferred that the line height of the printing pattern is small in order to form a pattern having a fine size. However, when the line height of the printing pattern is small, the uniformity of the line height may be reduced, which is problematic. However, in the present invention, the line height uniformity as described above may be achieved even in the printing pattern having a line height of 500 nm or less and preferably 300 nm or less. Herein, the line height of the printing pattern is based on the dried state.

In an exemplary embodiment of the present invention, a printing pattern may be formed by the above-described configuration so as to have a small rate of change in line width. In the present invention, the rate of change in line width of the printing pattern may reach, for example, 20% or less, preferably 10% or less and more preferably 5% or less. When the rate of change in line width is 20% or less, the pattern may be rated normal. The smaller the rate of change in line width is, the higher the precision of the pattern is. The smaller the rate of change in line width is, the higher the possibility that the pattern crossing portion may be normally implemented and the hair ring may not be generated is. The hair ring means a phenomenon that the pattern is hanging down during the off process. Herein, the line width of the printing pattern is based on the dried state.

The rate of change in line width (%) may be represented by the following Equation 2. In Equation 2, the line width of the printing pattern and the line width of the cliché pattern mean a line width of a part which corresponds to each other.

Rate of change in line width (%)={(line width size of the printing pattern−line width size of the cliché pattern)/(line width size of the cliché pattern)}×100     [Equation 2]

It is preferable that the medium boiling point solvent have the solubility parameter difference of 3 $(cal \cdot cm)^{1/2}$ or less to the binder resin and 4 $(cal \cdot cm)^{1/2}$ or more to the silicon-based blanket, and the swelling parameter of 2 or less to the silicon-based blanket.

When the composition for printing according to an exemplary embodiment of the present invention is used, a fine pattern having a line width or line spacing of 30 micrometers or less, preferably 20 micrometers or less and more preferably 15 micrometers or less may be formed, and a fine pattern having a line width of 7 micrometers or less and more preferably 5 micrometers or less may also be formed. The pattern may have a line height of 500 nm or less and more preferably 300 nm or less based on the dried state.

In an exemplary embodiment of the present invention, the silicon-based blanket means the outer peripheral portion of the blanket is formed of a silicon-based material. The silicon-based material is not particularly limited as long as the material is a material including a curable group while including silicon, but the hardness is preferably from 20 to 70 and more preferably from 30 to 60. The hardness means Shore A hardness. The deformation of the blanket may occur within a suitable range by using a silicon-based material within the hardness range. When the hardness of the blanket material is too low, a part of the blanket may touch the engraved portion of the cliché due to the deformation of the blanket during the off process in which a part of the coating film of the composition for printing is removed by a cliché from the blanket, and thus the pattern precision may be deteriorated. Further, a material having a hardness of 70 or less may be selected by considering the easiness in selection of the blanket material.

For example, a polydimethyl siloxane (PDMS)-based curable material may be used as the silicon-based blanket material. Additives known in the art may be further included to the blanket material within the scope of not impairing the object of the present invention.

In an exemplary embodiment of the present invention, appropriate materials may be selected as the binder resin depending on the purpose of the final use. The composition for printing according to the present invention is preferably a composition for forming a resist pattern. In this case, it is preferred that Novolac resin is used as the binder resin. Novolac resin is preferred because the resin is advantageous in terms of forming a resist pattern and has excellent compatibility with solvents which satisfy conditions according to the present invention as described above. In addition, Novolac resin has excellent chemical resistance to an etchant, and thus it is possible to perform a stable etching process. The resin has high solubility to a stripping solution, and thus is advantageous in that foreign materials are less frequently generated after the peeling-off and the time for peeling-off is reduced. The Novolac resin has a weight average molecular weight of preferably from 2,000 to 8,000. When the weight average molecular weight is less than 2,000, a sufficient chemical resistance to the etchant may not be secured to cause cracks or peeling-off on the resist coating film during the etching process. When the weight average molecular weight is more than 8,000, the solubility to a stripping solution may be reduced depending on curing conditions.

The Novolac resin may be prepared through a condensation reaction of a phenol-based compound and an aldehyde-based compound. As the phenol-based compound, those known in the art may be used, and for example, at least one selected from the group consisting of m-cresol, o-cresol, p-cresol, 2,5-xylenol, 3,4-xylenol, 3,5-xylenol and 2,3,5-trimethyl phenol may be used. As the aldehyde-based compound, those known in the art may be used, and for example, at least one selected from the group consisting of formaldehyde, paraformaldehyde, acetoaldehyde, benzaldehyde, phenylaldehyde and salicylaldehyde may be used. The Novolac resin may further include any monomer within the scope of not impairing the object of the present invention. In an exemplary embodiment of the present invention, the high-boiling point solvent is not particularly limited as long as the solvent satisfies the above-described requirements, but may be an aromatic alcohol-based solvent. More specifically, as the high-boiling point solvent, at least one selected from the group consisting of resorcinol, m-cresol, o-cresol, p-cresol, benzyl alcohol, phenol, 4-methoxybenzyl alcohol, dimethyl sulfoxide, propylene glycol phenyl ester, ethylene glycol, ethylene glycol phenyl ester and octanol may be used. These solvents may be used either alone or in combination of two or more thereof.

The medium boiling point solvent is not particularly limited as long as the solvent satisfies the aforementioned requirements, and at least one selected from the group consisting of ethyl lactate, PGMEA, methyl-3-methoxy propionate, methylamylketone, ethyl-3-ethoxy propionate and butyl acetate may be used. These solvents may be used alone or in combination of two or more kinds. However, the scope of the present invention is not limited thereto.

The low-boiling point solvent is not particularly limited as long as the solvent satisfies the above-described requirements, and alcohols, ketones, acetates, and the like may be used. Specifically, at least one selected from the group consisting of dimethyl carbonate, methanol, methyl ethyl ketone, isopropyl alcohol, ethyl acetate, ethanol, propanol and allyl alcohol may be used. These solvents may be used either alone or in combination of two or more thereof. However, the scope of the present invention is not limited only to these examples.

It is preferable that the printing composition according to the present invention include 5 to 30 wt % of the binder resin, 50 to 85 wt % of the low boiling point solvent, 0.5 to 15 wt % of the medium boiling point solvent and 1 to 25 wt % of the high boiling point solvent. The composition for printing according to an exemplary embodiment of the present invention may additionally include a surfactant. The surfactant may use a typical leveling agent, for example, a silicon-based, a fluorine-based or a polyether-based surfactant.

The composition for printing according to an exemplary embodiment of the present invention may additionally include a tackifier. As the tackifier, a melamine-based, a styrene-based or an acrylic oligomer or polymer may be used. The oligomer or polymer has a weight average molecular weight of preferably 5,000 or less, more preferably 3,000 or less and even more preferably 1,000 or less.

The contents of the surfactant and the tackifier may be selected depending on materials added and components of the composition for printing. For example, each of the surfactant and the tackifier may be added in an amount of 2 wt % or less, preferably 1 wt % less and more preferably 0.5 wt % or less, based on the total amount of the composition for printing.

The composition for printing according to an exemplary embodiment of the present invention may be prepared by mixing the above-described components. If necessary, filtration may be performed by using a filter to prepare the composition. Foreign materials or dust may be removed by such a filtration.

In addition, in an exemplary embodiment of the present invention, a method for printing using the above-described composition for printing using the silicon-based blanket is provided. The printing method includes printing the composition for printing. Specifically, the printing method includes coating the composition for reverse offset printing on a silicon-based blanket; bring a cliché into contact with a coating film of the composition for reverse offset printing, which is coated on the silicon-based blanket to remove a part of the coating film; and transferring the coating film of the composition for reverse offset printing remaining on the silicon-based blanket to an object to be printed. If necessary, drying or curing the composition for printing transferred to the object to be printed may be additionally included.

The reverse offset printing method is illustrated in FIG. 1. The reverse offset printing method includes i) coating a composition for printing on a blanket; ii) bringing a cliché in which a pattern corresponding to a pattern to be formed is formed as an engraved shape into contact with the blanket to form a pattern of the composition for printing, which corresponds to the pattern, on the blanket; iii) transferring the pattern of the composition for printing on the blanket to an object to be printed. At this time, the outer peripheral portion of the blanket is formed of a silicon-based material.

In FIG. 1, reference numerical 10 is a coater which coats a metal pattern material on the blanket, reference numerical 20 is a roll-type support for supporting a blanket, reference numerical 21 is a blanket, and reference numerical 22 is a printing composition pattern material coated on a blanket. Reference numerical 30 is a cliché support and reference numerical 31 is a cliché having a pattern, in which a pattern corresponding to a pattern to be formed is formed as an engraved shape. Reference numerical 40 is an object to be printed and reference numerical 41 is a printing composition pattern transferred as an object to be printed.

A transfer rate over the entire surface of the composition for printing according to an exemplary embodiment of the present invention may be from 80% to 100%. The transfer rate over the entire surface may be confirmed in a pattern in which the composition for printing is transferred to an object to be printed, and is based on a state in which the printing pattern is dried. The transfer rate over the entire surface (%) may be represented by the following Equation 3.

The transfer rate over the entire surface (%)={(Area of a composition for printing transferred to an object to be printed mm$^2$)/(100 mm×100 mm)}×100    [Equation 3]

When the composition for printing according to an exemplary embodiment of the present invention is dried or cured, the process temperature may be selected in a range of from normal temperature to 350° C., and the drying or curing temperature depending on the binder resin is selected in a range of from normal temperature to 350° C. and preferably from 50° C. to 300° C. The drying or curing time may be selected depending on the component and composition of the composition and the processing temperature.

A pattern formed by using the composition for printing and the printing method according to an exemplary embodiment of the present invention may have a line width and a line spacing of, for example, from several micrometers to several ten micrometers, specifically 100 micrometers or less, preferably 80 micrometers or less and more preferably 30 micrometers or less. In particular, according to the present invention, a fine pattern which may not be formed by an inkjet printing method, and the like, which were previously applied, for example, a pattern having a line width of 20 micrometers or less, preferably 15 micrometers or less, more preferably 7 micrometers or less and even more preferably 5 micrometers or less may be realized. The line width may be formed in a size of 0.5 micrometers or more, preferably 1 micrometers or more and more preferably 3 micrometers or more.

Accordingly, when the composition for printing and the printing method according to an exemplary embodiment of the present invention are used, two or more patterns having different line widths may be formed on the same object to be printed simultaneously. In particular, in the present invention, a pattern having a line width of 100 micrometers or less and a pattern having a line width of 7 micrometers or less may be formed on the same object to be printed simultaneously.

A pattern formed by the composition for printing and the printing method of the present invention may be used as a resist pattern. The resist pattern may be used as an etching resist for forming a conductive pattern, a metal pattern, a glass pattern, a semiconductor pattern, and the like. For example, the resist pattern may be used as a resist for forming an electrode or auxiliary electrode of various electronic devices including a display such as TFT, touch screen, LCD or PDP, a light-emitting device and a solar cell. Furthermore, a pattern formed by the composition for printing and the printing method may also be used as an insulating pattern as required in various electronic devices. The insulating pattern may be an insulating pattern which covers a metal pattern. For example, the insulating pattern may be used as a passivation layer which covers an auxiliary electrode of an OLED lighting substrate.

The present invention will be described in more detail with reference to Examples, Comparative Examples and Experimental Examples. However, the following Examples, Comparative Examples and Experimental Examples are provided for illustration of the present invention, and the scope of the present invention is not limited thereto.

Example 1

10 g of the novolac resin having the polystyrene-reduced weight average molecular weight of 4,500 manufactured by mixing m-cresol and p-cresol at a weight ratio of 5:5, 0.5 g of the melamine-based adhesion provider, and 0.5 g of the surfactant were dissolved in 75 g of ethanol that was the low boiling point solvent, 5 g of PGMEA that was the medium boiling point solvent, and 9 g of benzyl alcohol that was the high boiling point solvent, and then filtered by the filter having the size of 1 μm to manufacture the printing composition. In this case, the solubility parameter difference between the low boiling point solvent and the binder resin was 1.2, the solubility parameter difference between the high boiling point solvent and the binder resin was 0.6, the solubility parameter difference between the low boiling point solvent and the silicon-based blanket was 5.4, the solubility parameter difference between the high boiling point solvent and the silicon-based blanket was 4.8, the swelling parameter of the low boiling point solvent to the silicon-based blanket was 1.3, and the swelling parameter of the high boiling point solvent to the silicon-based blanket was 0.1. Hardness of the silicon-based blanket was 47 when measured by the shore A durometer. The entire surface transfer ratio, the initial printing waiting time, the continuous printing number, the printing waiting margin and the pattern precision of the manufactured printing composition were measured by the following methods of Experimental Examples 1 to 5.

Example 2

10 g of the novolac resin having the polystyrene-reduced weight average molecular weight of 4,500 manufactured by mixing m-cresol and p-cresol at a weight ratio of 5:5, 0.5 g of the melamine-based adhesion provider, and 0.5 g of the surfactant were dissolved in 75 g of 1-propanol that was the low boiling point solvent, 5 g of PGMEA that was the medium boiling point solvent, and 9 g of benzyl alcohol that was the high boiling point solvent, and then filtered by the filter having the size of 1 μm to manufacture the printing composition. In this case, the solubility parameter difference between the low boiling point solvent and the binder resin was 0.4, the solubility parameter difference between the high boiling point solvent and the binder resin was 0.6, the solubility parameter difference between the low boiling point solvent and the silicon-based blanket was 4.6, the solubility parameter difference between the high boiling point solvent and the silicon-based blanket was 4.8, the swelling parameter of the low boiling point solvent to the silicon-based blanket was 2.0, and the swelling parameter of the high boiling point solvent to the silicon-based blanket was 0.1. Hardness of the silicon-based blanket was 47 when measured by the shore A durometer. The entire surface transfer ratio, the initial printing waiting time, the continuous printing number, the printing waiting margin and the pattern precision of the manufactured printing composition were measured by the following methods of Experimental Examples 1 to 5.

Comparative Example 1

10 g of the novolac resin having the polystyrene-reduced weight average molecular weight of 4,500 manufactured by mixing m-cresol and p-cresol at a weight ratio of 5:5, 0.5 g of the melamine-based adhesion provider, and 0.5 g of the surfactant were dissolved in 75 g of formic acid that was the low boiling point solvent, 5 g of PGMEA that was the medium boiling point solvent, and 9 g of benzyl alcohol that was the high boiling point solvent, and then filtered by the filter having the size of 1 μm to manufacture the printing composition. In this case, the solubility parameter difference between the low boiling point solvent and the binder resin was 0.6, the solubility parameter difference between the high boiling point solvent and the binder resin was 0.6, the solubility parameter difference between the low boiling point solvent and the silicon-based blanket was 4.8, the solubility parameter difference between the high boiling point solvent and the silicon-based blanket was 4.8, the swelling parameter of the low boiling point solvent to the silicon-based blanket was 1.2, and the swelling parameter of the high boiling point solvent to the silicon-based blanket was 0.1. Hardness of the silicon-based blanket was 47 when measured by the shore A durometer. The entire surface transfer ratio, the initial printing waiting time, the continuous printing number, the printing waiting margin and the pattern precision of the manufactured printing composition were measured by the following methods of Experimental Examples 1 to 5.

Example 3

10 g of the novolac resin having the polystyrene-reduced weight average molecular weight of 4,500 manufactured by mixing m-cresol and p-cresol at a weight ratio of 5:5, 0.5 g of the melamine-based adhesion provider, and 0.5 g of the surfactant were dissolved in 75 g of ethanol that was the low boiling point solvent, 5 g of butyl acetate that was the medium boiling point solvent, and 9 g of benzyl alcohol that was the high boiling point solvent, and then filtered by the filter having the size of 1 μm to manufacture the printing composition. In this case, the solubility parameter difference between the low boiling point solvent and the binder resin was 1.2, the solubility parameter difference between the high boiling point solvent and the binder resin was 0.6, the solubility parameter difference between the low boiling point solvent and the silicon-based blanket was 5.4, the solubility parameter difference between the high boiling point solvent and the silicon-based blanket was 4.8, the swelling parameter of the low boiling point solvent to the silicon-based blanket was 1.3, and the swelling parameter of the high boiling point solvent to the silicon-based blanket was 0.1. Hardness of the silicon-based blanket was 47 when measured by the shore A durometer. The entire surface transfer ratio, the initial printing waiting time, the continuous printing number, the printing waiting margin and the pattern precision of the manufactured printing composition were measured by the following methods of Experimental Examples 1 to 5.

Comparative Example 2

10 g of the novolac resin having the polystyrene-reduced weight average molecular weight of 4,500 manufactured by mixing m-cresol and p-cresol at a weight ratio of 5:5, 0.5 g of the melamine-based adhesion provider, and 0.5 g of the surfactant were dissolved in 75 g of ethanol that was the low boiling point solvent, 5 g of isopropyl acetate that was the medium boiling point solvent, and 9 g of benzyl alcohol that was the high boiling point solvent, and then filtered by the filter having the size of 1 μm to manufacture the printing composition. In this case, the solubility parameter difference between the low boiling point solvent and the binder resin was 1.2, the solubility parameter difference between the high boiling point solvent and the binder resin was 0.6, the solubility parameter difference between the low boiling point solvent and the silicon-based blanket was 5.4, the solubility parameter difference between the high boiling point solvent and the silicon-based blanket was 4.8, the swelling parameter of the low boiling point solvent to the silicon-based blanket was 1.3, and the swelling parameter of the high boiling point solvent to the silicon-based blanket was 0.1. Hardness of the silicon-based blanket was 47 when measured by the shore A durometer. The entire surface transfer ratio, the initial printing waiting time, the continuous printing number, the printing waiting margin and the pattern precision of the manufactured printing composition were measured by the following methods of Experimental Examples 1 to 5.

Comparative Example 3

10 g of the novolac resin having the polystyrene-reduced weight average molecular weight of 4,500 manufactured by mixing m-cresol and p-cresol at a weight ratio of 5:5, 0.5 g of the melamine-based adhesion provider, and 0.5 g of the surfactant were dissolved in 75 g of ethanol that was the low boiling point solvent, 5 g of PGMEA that was the medium boiling point solvent, and 9 g of N,N-dimethylformamide that was the high boiling point solvent, and then filtered by the filter having the size of 1 μm to manufacture the printing composition. In this case, the solubility parameter difference between the low boiling point solvent and the binder resin was 1.2, the solubility parameter difference between the high boiling point solvent and the binder resin was 0.6, the solubility parameter difference between the low boiling point solvent and the silicon-based blanket was 5.4, the solubility parameter difference between the high boiling point solvent and the silicon-based blanket was 4.8, the swelling parameter of the low boiling point solvent to the silicon-based blanket was 1.3, and the swelling parameter of the high boiling point solvent to the silicon-based blanket was 0.1. Hardness of the silicon-based blanket was 47 when measured by the shore A durometer. The entire surface transfer ratio, the initial printing waiting time, the continuous printing number, the printing waiting margin and the pattern precision of the manufactured printing composition were measured by the following methods of Experimental Examples 1 to 5.

Example 4

10 g of the novolac resin having the polystyrene-reduced weight average molecular weight of 4,500 manufactured by mixing m-cresol and p-cresol at a weight ratio of 5:5, 0.5 g of the melamine-based adhesion provider, and 0.5 g of the surfactant were dissolved in 75 g of ethanol that was the low boiling point solvent, 5 g of PGMEA that was the medium boiling point solvent, and 9 g of 4-methoxybenzyl alcohol that was the high boiling point solvent, and then filtered by the filter having the size of 1 μm to manufacture the printing composition. In this case, the solubility parameter difference between the low boiling point solvent and the binder resin was 1.2, the solubility parameter difference between the high boiling point solvent and the binder resin was 0.8, the solubility parameter difference between the low boiling point solvent and the silicon-based blanket was 5.4, the solubility parameter difference between the high boiling point solvent and the silicon-based blanket was 5, the swelling parameter of the low boiling point solvent to the silicon-based blanket was 1.3, and the swelling parameter of the high boiling point solvent to the silicon-based blanket was 0.1. Hardness of the silicon-based blanket was 47 when measured by the shore A durometer. The entire surface transfer ratio, the initial printing waiting time, the continuous printing number, the printing waiting margin and the pattern precision of the manufactured printing composition were measured by the following methods of Experimental Examples 1 to 5.

Example 5

10 g of the novolac resin having the polystyrene-reduced weight average molecular weight of 4,500 manufactured by mixing m-cresol and p-cresol at a weight ratio of 5:5, 0.5 g of the melamine-based adhesion provider, and 0.5 g of the surfactant were dissolved in 75 g of methanol that was the low boiling point solvent, 5 g of PGMEA that was the medium boiling point solvent, and 9 g of benzyl alcohol that was the high boiling point solvent, and then filtered by the filter having the size of 1 μm to manufacture the printing composition. In this case, the solubility parameter difference between the low boiling point solvent and the binder resin was 3, the solubility parameter difference between the high boiling point solvent and the binder resin was 0.6, the solubility parameter difference between the low boiling point solvent and the silicon-based blanket was 7.2, the solubility parameter difference between the high boiling point solvent and the silicon-based blanket was 4.8, the swelling parameter of the low boiling point solvent to the silicon-based blanket was 0.3, and the swelling parameter of the high boiling point solvent to the silicon-based blanket was 0.1. Hardness of the silicon-based blanket was 47 when measured by the shore A durometer. The entire surface transfer ratio, the initial printing waiting time, the continuous printing number, the printing waiting margin and the pattern precision of the manufactured printing composition were measured by the following methods of Experimental Examples 1 to 5.

Example 6

10 g of the novolac resin having the polystyrene-reduced weight average molecular weight of 4,500 manufactured by mixing m-cresol and p-cresol at a weight ratio of 5:5, 0.5 g of the melamine-based adhesion provider, and 0.5 g of the surfactant were dissolved in 75 g of methanol that was the low boiling point solvent, 5 g of PGMEA that was the medium boiling point solvent, and 9 g of dimethyl sulfoxide that was the high boiling point solvent, and then filtered by the filter having the size of 1 μm to manufacture the printing composition. In this case, the solubility parameter difference between the low boiling point solvent and the binder resin was 1.2, the solubility parameter difference between the high boiling point solvent and the binder resin was 3, the solubility parameter difference between the low boiling point solvent and the silicon-based blanket was 5.4, the solubility parameter difference between the high boiling point solvent and the silicon-based blanket was 7.2, the swelling parameter of the low boiling point solvent to the silicon-based blanket was 1.3, and the swelling parameter of the high boiling point solvent to the silicon-based blanket was 0.2. Hardness of the silicon-based blanket was 47 when measured by the shore A durometer. The entire surface transfer ratio, the initial printing waiting time, the continuous printing number, the printing waiting margin and the pattern precision of the manufactured printing composition were measured by the following methods of Experimental Examples 1 to 5.

Comparative Example 4

10 g of the novolac resin having the polystyrene-reduced weight average molecular weight of 4,500 manufactured by mixing m-cresol and p-cresol at a weight ratio of 5:5, 0.5 g of the melamine-based adhesion provider, and 0.5 g of the surfactant were dissolved in 75 g of ethanol that was the low boiling point solvent, 5 g of PGMEA that was the medium boiling point solvent, and 9 g of ethylene glycol that was the high boiling point solvent, and then filtered by the filter having the size of 1 μm to manufacture the printing composition. In this case, the solubility parameter difference between the low boiling point solvent and the binder resin was 1.2, the solubility parameter difference between the high boiling point solvent and the binder resin was 3.1, the solubility parameter difference between the low boiling point solvent and the silicon-based blanket was 5.4, the solubility parameter difference between the high boiling point solvent and the silicon-based blanket was 7.3, the swelling parameter of the low boiling point solvent to the silicon-based blanket was 1.3, and the swelling parameter of the high boiling point solvent to the silicon-based blanket was 0. Hardness of the silicon-based blanket was 47 when measured by the shore A durometer. The entire surface transfer ratio, the initial printing waiting time, the continuous printing number, the printing waiting margin and the pattern precision of the manufactured printing composition were measured by the following methods of Experimental Examples 1 to 5.

Example 7

10 g of the novolac resin having the polystyrene-reduced weight average molecular weight of 4,500 manufactured by mixing m-cresol and p-cresol at a weight ratio of 5:5, 0.5 g of the melamine-based adhesion provider, and 0.5 g of the surfactant were dissolved in 75 g of allyl alcohol that was the low boiling point solvent, 5 g of PGMEA that was the medium boiling point solvent, and 9 g of benzyl alcohol that was the high boiling point solvent, and then filtered by the filter having the size of 1 μm to manufacture the printing composition. In this case, the solubility parameter difference between the low boiling point solvent and the binder resin was 0.3, the solubility parameter difference between the high boiling point solvent and the binder resin was 0.6, the solubility parameter difference between the low boiling point solvent and the silicon-based blanket was 4.5, the solubility parameter difference between the high boiling point solvent and the silicon-based blanket was 4.8, the swelling parameter of the low boiling point solvent to the silicon-based blanket was 1.9, and the swelling parameter of the high boiling point solvent to the silicon-based blanket was 0.1. Hardness of the silicon-based blanket was 47 when measured by the shore A durometer. The entire surface transfer ratio, the initial printing waiting time, the continuous printing number, the printing waiting margin and the pattern precision of the manufactured printing composition were measured by the following methods of Experimental Examples 1 to 5.

Comparative Example 5

10 g of the novolac resin having the polystyrene-reduced weight average molecular weight of 4,500 manufactured by mixing m-cresol and p-cresol at a weight ratio of 5:5, 0.5 g of the melamine-based adhesion provider, and 0.5 g of the surfactant were dissolved in 75 g of dimethyl carbonate that was the low boiling point solvent, 5 g of PGMEA that was the medium boiling point solvent, and 9 g of benzyl alcohol that was the high boiling point solvent, and then filtered by the filter having the size of 1 μm to manufacture the printing composition. In this case, the solubility parameter difference between the low boiling point solvent and the binder resin was 1.6, the solubility parameter difference between the high boiling point solvent and the binder resin was 0.6, the solubility parameter difference between the low boiling point solvent and the silicon-based blanket was 2.6, the solubility parameter difference between the high boiling point solvent and the silicon-based blanket was 4.8, the swelling parameter of the low boiling point solvent to the silicon-based blanket was 1.9, and the swelling parameter of the high boiling point solvent to the silicon-based blanket was 0.1. Hardness of the silicon-based blanket was 47 when measured by the shore A durometer. The entire surface transfer ratio, the initial printing waiting time, the continuous printing number, the printing waiting margin and the pattern precision of the manufactured printing composition were measured by the following methods of Experimental Examples 1 to 5.

Comparative Example 6

10 g of the novolac resin having the polystyrene-reduced weight average molecular weight of 4,500 manufactured by mixing m-cresol and p-cresol at a weight ratio of 5:5, 0.5 g of the melamine-based adhesion provider, and 0.5 g of the surfactant were dissolved in 75 g of ethanol that was the low boiling point solvent, 5 g of PGMEA that was the medium boiling point solvent, and 9 g of m-cresol that was the high boiling point solvent, and then filtered by the filter having the size of 1 μm to manufacture the printing composition. In this case, the solubility parameter difference between the low boiling point solvent and the binder resin was 1.2, the solubility parameter difference between the high boiling point solvent and the binder resin was 1.3, the solubility parameter difference between the low boiling point solvent and the silicon-based blanket was 5.4, the solubility parameter difference between the high boiling point solvent and the silicon-based blanket was 2.9, the swelling parameter of the low boiling point solvent to the silicon-based blanket was 1.3, and the swelling parameter of the high boiling point solvent to the silicon-based blanket was 0. Hardness of the silicon-based blanket was 47 when measured by the shore A durometer. The entire surface transfer ratio, the initial printing waiting time, the continuous printing number, the printing waiting margin and the pattern precision of the manufactured printing composition were measured by the following methods of Experimental Examples 1 to 5.

Comparative Example 7

10 g of the novolac resin having the polystyrene-reduced weight average molecular weight of 4,500 manufactured by mixing m-cresol and p-cresol at a weight ratio of 5:5, 0.5 g of the melamine-based adhesion provider, and 0.5 g of the surfactant were dissolved in 75 g of isopropyl alcohol that was the low boiling point solvent, 5 g of PGMEA that was the medium boiling point solvent, and 9 g of benzyl alcohol that was the high boiling point solvent, and then filtered by the filter having the size of 1 μm to manufacture the printing composition. In this case, the solubility parameter difference between the low boiling point solvent and the binder resin was 0, the solubility parameter difference between the high boiling point solvent and the binder resin was 0.6, the solubility parameter difference between the low boiling point solvent and the silicon-based blanket was 4.2, the solubility parameter difference between the high boiling point solvent and the silicon-based blanket was 4.8, the swelling parameter of the low boiling point solvent to the silicon-based blanket was 2.8, and the swelling parameter of the high boiling point solvent to the silicon-based blanket was 0.1. Hardness of the silicon-based blanket was 47 when measured by the shore A durometer. The entire surface transfer ratio, the initial printing waiting time, the continuous printing number, the printing waiting margin and the pattern precision of the manufactured printing composition were measured by the following methods of Experimental Examples 1 to 5.

Comparative Example 8

10 g of the novolac resin having the polystyrene-reduced weight average molecular weight of 4,500 manufactured by mixing m-cresol and p-cresol at a weight ratio of 5:5, 0.5 g of the melamine-based adhesion provider, and 0.5 g of the surfactant were dissolved in 75 g of ethanol that was the low boiling point solvent, 5 g of PGMEA that was the medium boiling point solvent, and 9 g of octanol that was the high boiling point solvent, and then filtered by the filter having the size of 1 μm to manufacture the printing composition. In this case, the solubility parameter difference between the low boiling point solvent and the binder resin was 1.2, the solubility parameter difference between the high boiling point solvent and the binder resin was 1.2, the solubility parameter difference between the low boiling point solvent and the silicon-based blanket was 5.4, the solubility parameter difference between the high boiling point solvent and the silicon-based blanket was 3, the swelling parameter of the low boiling point solvent to the silicon-based blanket was 1.3, and the swelling parameter of the high boiling point solvent to the silicon-based blanket was 2.7. Hardness of the silicon-based blanket was 47 when measured by the shore A durometer. The entire surface transfer ratio, the initial printing waiting time, the continuous printing number, the printing waiting margin and the pattern precision of the manufactured printing composition were measured by the following methods of Experimental Examples 1 to 5.

Example 8

10 g of the novolac resin having the polystyrene-reduced weight average molecular weight of 4,500 manufactured by mixing m-cresol and p-cresol at a weight ratio of 5:5, 0.5 g of the melamine-based adhesion provider, and 0.5 g of the surfactant were dissolved in 75 g of ethanol that was the low boiling point solvent, 5 g of PGMEA that was the medium boiling point solvent, and 9 g of ethylene glycol phenylester that was the high boiling point solvent, and then filtered by the filter having the size of 1 μm to manufacture the printing composition. In this case, the solubility parameter difference between the low boiling point solvent and the binder resin was 1.2, the solubility parameter difference between the high boiling point solvent and the binder resin was 0.6, the solubility parameter difference between the low boiling point solvent and the silicon-based blanket was 5.4, the solubility parameter difference between the high boiling point solvent and the silicon-based blanket was 4.8, the swelling parameter of the low boiling point solvent to the silicon-based blanket was 1.3, and the swelling parameter of the high boiling point solvent to the silicon-based blanket was 0.1. Hardness of the silicon-based blanket was 62 when measured by the shore A durometer. The entire surface transfer ratio, the initial printing waiting time, the continuous printing number, the printing waiting margin and the pattern precision of the manufactured printing composition were measured by the following methods of Experimental Examples 1 to 5.

Comparative Example 9

10 g of the novolac resin having the polystyrene-reduced weight average molecular weight of 4,500 manufactured by mixing m-cresol and p-cresol at a weight ratio of 5:5, 0.5 g of the melamine-based adhesion provider, and 0.5 g of the surfactant were dissolved in 75 g of ethanol that was the low boiling point solvent, 5 g of PGMEA that was the medium boiling point solvent, and 9 g of ethylene glycol phenylester that was the high boiling point solvent, and then filtered by the filter having the size of 1 μm to manufacture the printing composition. In this case, the solubility parameter difference between the low boiling point solvent and the binder resin was 1.2, the solubility parameter difference between the high boiling point solvent and the binder resin was 0.6, the solubility parameter difference between the low boiling point solvent and the silicon-based blanket was 5.4, the solubility parameter difference between the high boiling point solvent and the silicon-based blanket was 4.8, the swelling parameter of the low boiling point solvent to the silicon-based blanket was 1.3, and the swelling parameter of the high boiling point solvent to the silicon-based blanket was 0.1. Hardness of the silicon-based blanket was 18 when measured by the shore A durometer. The entire surface transfer ratio, the initial printing waiting time, the continuous printing number, the printing waiting margin and the pattern precision of the manufactured printing composition were measured by the following methods of Experimental Examples 1 to 5.

Experimental Example 1

Transfer Rate Over Entire Surface

The composition in Examples 1 to 8 and Comparative Examples 1 to 9 was coated on a silicon blanket having a hardness of 47 at a rate of 50 mm/s to form a coating film having a thickness of 3 μm before drying. After the coating, the film was allowed to stand for 30 sec, and then transfer over the entire surface was performed on a glass substrate having a size of 100 mm×100 mm under conditions of a transfer rate of 50 mm/s and a contact pressure (length deformed at one point when a printing pressure is applied) of 20 μm to measure an area of the composition for printing transferred to the glass substrate which was an object to be printed.

The transfer rate over the entire surface (%)={(Area of a composition for printing transferred to an object to be printed mm$^2$)/(100 mm×100 mm)}×100   [Equation 3]

A: 100% transferred
B: 80% transferred
C: 50% transferred
D: 30% transferred
E: 10% transferred
F: Not transferred It is preferable that the entire surface transfer ratio of the printing composition be 80 to 100%. From the measurement results of the following Table 2, it can be seen that the entire surface transfer ratio is 100% in the Examples.

Experimental Example 2

Initial Printing Wait Time

The composition in Examples 1 to 8 and Comparative Examples 1 to 9 was coated on a silicon blanket at a rate of 50 mm/s to form a coating film having a thickness of 3 μm before drying. After the coating, the film was allowed to stand for 30 sec or more, then a transfer was performed on a cliché having a size of 100 mm×100 mm with an engraved mesh pattern having a line width of 7 μm and a distance between lines of 300 μm under conditions of a transfer rate of 50 mm/s and a contact pressure of 20 μm to form a pattern corresponding to the cliché on a blanket. The pattern of the composition for printing formed on the blanket was transferred on a glass substrate having a size of 100 mm×100 mm under conditions of a transfer rate of mm/s and a contact pressure (length deformed at one point when a printing pressure is applied) of 20 μm to form a final pattern. A time when the normal pattern was implemented was confirmed by varying the process wait time. An initial printing wait time may be represented by the following Equation 4. The minimum initial printing wait time was 30 sec.

(Initial printing wait time)=(Off Initiation time point)−(Coating completion time point)   [Equation 4]

A normal pattern having a rate of change in line width of a pattern formed on a glass substrate within 20% compared to a cliché was used as a reference.

It is preferable that the initial printing waiting time be 30 to 45 sec. From the measurement results of the following Table 2, it can be seen that measurement is impossible or the result is 45 sec or more in the Comparative Examples and the result is 30 to 45 sec in the Examples.

Experimental Example 3

Continuous Printing Properties

The composition in Examples 1 to 8 and Comparative Examples 1 to 9 was coated on a silicon blanket at a rate of 50 mm/s to form a coating film having a thickness of 3 μm before drying. After the coating, an initial printing wait time at which a normal pattern was formed was applied, and then a continuous printing having an engraved mesh pattern with a line width of 7 μm and a distance between lines of 300 μm was performed to measure a change in pattern line width, and a printing number which maintained a rate of change in line width within 10% compared to the initial printing pattern was measured.

It is preferable that the continuous printing number be 10 or more. From the measurement results of the following Table 2, it can be seen that measurement is impossible or the result is less than 10 in the Comparative Examples and the result is 10 or more in the Examples.

Experimental Example 4

Measurement of the Printing Waiting Margin

Examples 1 to 8 and Comparative Examples 1 to 9 were applied on the silicon blanket at a rate of 50 mm/s to form a coat having a thickness of 3 μm before drying. Transferring was performed on the cliché having the size of 100 mm×100 mm and the intaglio mesh pattern having the line width of 7 μm and the line interval of 300 μm after waiting for 30 sec or more after the application was performed under the condition of transferring rate of 50 mm/s and contact pressure of 20 μm (length modified at one point when the printing pressure was applied) to form the pattern corresponding to the cliche on the blanket. The printing composition pattern formed on the blanket was transferred on the glass substrate having the size of 100 mm×100 mm under the condition of transferring rate of 50 mm/s and contact pressure of 20 μm to form the final pattern. The minimum waiting time and the maximum waiting time during which the normal pattern was implemented were confirmed while changing a process waiting time.

(printing waiting margin)=(maximum waiting time during which the normal pattern is implemented)−(minimum waiting time during which the normal pattern is implemented)  [Equation 5]

It is preferable that the printing waiting margin be 25 sec or more. From the measurement results of the following Table 2, it can be seen that measurement is impossible or the result is less than 25 sec in the Comparative Examples and the result is 25 sec or more in the Examples.

Experimental Example 5

Measurement of Pattern Precision

The composition in Examples 1 to 8 and Comparative Examples 1 to 9 was coated on a silicon blanket at a rate of 50 mm/s to form a coating film having a thickness of 3 μm before drying. After the coating, a printing wait time at which a normal pattern was formed was applied, and then a transfer was performed on a cliché having a size of 100 mm×100 mm with an engraved mesh pattern having a line width of 7 μm and a distance between lines of 300 μm under conditions of a transfer rate of 50 mm/s and a contact pressure of 20 μm to form a pattern corresponding to the cliché on a blanket. The pattern of the composition for printing formed on the blanket was transferred on a glass substrate having a size of 100 mm×100 mm under conditions of a transfer rate of 50 mm/s and a contact pressure of 20 μm to form a final pattern. The pattern secured was observed with a microscope and evaluated in accordance with the following reference.

Rate of change in line width (%)={(line width size of the printing pattern−line width size of the cliché pattern)/(line width size of the cliché pattern)}×100  [Equation 2]

Hair ring: a phenomenon that the pattern is hanging down during the off process

A: Within 5% of Rate of Change in Line Width, Normal Implementation of Pattern Crossing Portion B: Within 10% of Rate of Change in Line Width, Occurrence of Line Disconnection of Pattern Crossing Portion C: Within 20% of Rate of Change in Line Width, Normal Implementation of Pattern Crossing Portion D: Within 20% of Rate of Change in Line Width, Occurrence of Line Disconnection of Pattern Crossing Portion E: 20% or more of Rate of Change in Line Width, Occurrence of Line Disconnection of Pattern Crossing Portion F: 20% or more of Rate of Change in Line Width, Occurrence of Line Disconnection of Pattern Crossing Portion and Occurrence of Hair Ring The conditions of Examples 1 to 8 and Comparative Examples 1 to 9 are described in the following Table 1, and the results of Experimental Examples 1 to 5 to Examples 1 to 8 and Comparative Examples 1 to 9 are described in Table 2.

TABLE 1

|  | I (□) | II (° C.) | III (° C.) | IV | V | VI | VII | VIII | IX | X |
|---|---|---|---|---|---|---|---|---|---|---|
| Example 1 | 78 | 146 | 205 | 1.2 | 0.6 | 5.4 | 4.8 | 1.3 | 0.1 | 47 |
| Example 2 | 97 | 146 | 205 | 0.4 | 0.6 | 4.6 | 4.8 | 2.0 | 0.1 | 47 |
| Comparative Example 1 | 101 | 146 | 205 | 0.6 | 0.6 | 4.8 | 4.8 | 1.2 | 0.1 | 47 |
| Example 3 | 78 | 127 | 205 | 1.2 | 0.6 | 5.4 | 4.8 | 1.3 | 0.1 | 47 |
| Comparative Example 2 | 78 | 89 | 205 | 1.2 | 0.6 | 5.4 | 4.8 | 1.3 | 0.1 | 47 |
| Comparative Example 3 | 78 | 146 | 153 | 1.2 | 0.6 | 5.4 | 4.8 | 1.3 | 0.1 | 47 |
| Example 4 | 78 | 146 | 259 | 1.2 | 0.8 | 5.4 | 5 | 1.3 | 0.1 | 47 |
| Example 5 | 65 | 146 | 205 | 3 | 0.6 | 7.2 | 4.8 | 0.3 | 0.1 | 47 |
| Example 6 | 78 | 146 | 189 | 1.2 | 3 | 5.4 | 7.2 | 1.3 | 0.2 | 47 |
| Comparative Example 4 | 78 | 146 | 197 | 1.2 | 3.1 | 5.4 | 7.3 | 1.3 | 0 | 47 |
| Example 7 | 97 | 146 | 205 | 0.3 | 0.6 | 4.5 | 4.8 | 1.9 | 0.1 | 47 |
| Comparative Example 5 | 90 | 146 | 205 | 1.6 | 0.6 | 2.6 | 4.8 | 1.9 | 0.1 | 47 |
| Comparative Example 6 | 78 | 146 | 203 | 1.2 | 1.3 | 5.4 | 2.9 | 1.3 | 0 | 47 |
| Comparative Example 7 | 83 | 146 | 205 | 0 | 0.6 | 4.2 | 4.8 | 2.8 | 0.1 | 47 |
| Comparative Example 8 | 78 | 146 | 195 | 1.2 | 1.2 | 5.4 | 3 | 1.3 | 2.7 | 47 |
| Example 8 | 78 | 146 | 205 | 1.2 | 0.6 | 5.4 | 4.8 | 1.3 | 0.1 | 62 |
| Comparative Example 9 | 78 | 146 | 205 | 1.2 | 0.6 | 5.4 | 4.8 | 1.3 | 0.1 | 18 |

I: Boiling point of low-boiling point solvent (° C.)

II: Boiling point of medium-boiling point solvent (° C.)

III: Boiling point of high-boiling point solvent (° C.)

IV: Difference in solubility parameter between low-boiling point solvent and binder resin V: Difference in solubility parameter between high-boiling point solvent and binder resin VI: Difference in solubility parameter between low-boiling point solvent and silicon-based blanket □: Difference in solubility parameter between high-boiling point solvent and silicon-based blanket □: Swelling parameter of low-boiling point solvent for silicon-based blanket □: Swelling parameter of high-boiling point solvent for silicon-based blanket □: Hardness of silicon-based blanket

TABLE 2

| | Transfer rate over entire surface | Initial printing wait time (sec) | Continuous printing properties (sheet) | Measurement of the Printing Waiting Margin(sec) | Pattern precision |
|---|---|---|---|---|---|
| Example 1 | A | 40 | 13 | 30 | A |
| Example 2 | A | 45 | 11 | 30 | A |
| Comparative Example1 | A | 50 | 9 | 25 | A |
| Example 3 | A | 40 | 13 | 25 | A |
| Comparative Example 2 | A | 40 | 13 | 15 | A |
| Comparative Example 3 | C | Immeasurable | Immeasurable | Immeasurable | Immeasurable |
| Example 4 | A | 50 | 10 | 30 | A |
| Example 5 | A | 40 | 13 | 25 | A |
| Example 6 | A | 40 | 11 | 20 | A |
| Comparative Example 4 | B | 40 | 10 | 15 | B |
| Example 7 | A | 45 | 9 | 30 | A |
| Comparative Example 5 | B | 45 | 9 | 20 | A |
| Comparative Example 6 | A | 45 | 9 | 20 | B |
| Comparative Example 7 | B | 45 | 7 | 15 | B |
| Comparative Example 8 | B | 45 | 5 | 25 | B |
| Example 8 | A | 35 | 13 | 20 | A |
| Comparative Example 9 | A | 45 | 2 | 35 | F |

DESCRIPTION OF REFERENCE NUMERALS

10: Coater which coats a metal pattern material on the blanket
20: Roll-type support for supporting a blanket
21: Blanket
22: Printing composition pattern material coated on a blanket
30: Cliché support
31: Cliché having a pattern
40: Object to be printed
41: Printing composition pattern transferred as an object to be printed

The invention claimed is:

1. A reverse offset printing composition, which is applied on a silicon-based blanket, comprising:
 1) a binder resin,
 2) a low boiling point solvent having a boiling point of less than 100° C.,
 3) a medium boiling point solvent having a boiling point of 100° C. or more and less than 180° C., and
 4) a high boiling point solvent having a boiling point of 180° C. or more,
 wherein the low boiling point solvent and the high boiling point solvent have a solubility parameter difference of 3 (cal·cm)½ or less with the binder resin and 4 (cal·cm)½ or more with the silicon-based blanket, and a swelling parameter of 2 or less for the silicon-based blanket.

2. The reverse offset printing composition of claim 1, wherein the binder resin is a novolac resin.

3. The reverse offset printing composition of claim 1, wherein a weight average molecular weight of the novolac resin is 2,000 to 8,000.

4. The reverse offset printing composition of claim 1, wherein the high boiling point solvent is an aromatic alcohol-based solvent.

5. The reverse offset printing composition of claim 4, wherein the high boiling point solvent includes one or more kinds selected from the group consisting of resorcinol, m-cresol, o-cresol, p-cresol, benzyl alcohol, dimethyl sulfoxide, ethylene glycol, ethylene glycol phenyl ester, propylene glycol phenyl ester, octanol and phenol.

6. The reverse offset printing composition of claim 1, wherein the medium boiling point solvent includes one or more kinds selected from the group consisting of ethyl lactate, PGMEA, methyl-3-methoxy propionate, methylamylketone and ethyl-3-ethoxy propionate.

7. The reverse offset printing composition of claim 1, wherein the low boiling point solvent includes one or more kinds selected from the group consisting of dimethyl carbonate, methanol, methylethylketone, isopropyl alcohol, ethyl acetate, ethanol, allyl alcohol and propanol.

8. The reverse offset printing composition of claim 1, wherein the boiling point of the medium boiling point solvent has a difference of 5° C. or more to the boiling point of each of the low boiling point solvent and the high boiling point solvent.

9. The reverse offset printing composition of claim 1, wherein the composition includes 5 to 30 wt % of the binder resin, 50 to 85 wt % of the low boiling point solvent, 0.5 to 15 wt % of the medium boiling point solvent and 1 to 25 wt % of the high boiling point solvent.

10. The reverse offset printing composition of claim 1, further comprising: one or more of a surfactant and an adhesion provider.

11. The reverse offset printing composition of claim 1, wherein hardness of the silicon-based blanket is Shore A hardness of 20 to 70.

12. The reverse offset printing composition of claim 1, wherein the reverse offset printing composition is for forming a resist pattern or an insulating pattern.

13. A reverse offset printing composition, which is applied on a silicon-based blanket, comprising:

1) 5 to 30 wt % of a binder resin,
2) 50 to 85 wt % of a low boiling point solvent having a boiling point of less than 100° C.,
3) 0.5 to 15 wt % of a medium boiling point solvent having a boiling point of 100° C. or more and less than 180° C., and
4) 1 to 25 wt % of a high boiling point solvent having a boiling point of 180° C. or more,
wherein the low boiling point solvent and the high boiling point solvent have a solubility parameter difference of 3 (cal·cm)½ or less with the binder resin and 4 (cal·cm)½ or more with the silicon-based blanket, and a swelling parameter of 2 or less for the silicon-based blanket.

14. A printing method using the reverse offset printing composition of claim 1.

15. The printing method of claim 14, comprising:
applying the printing composition on the silicon-based blanket to form a printing composition coating;
bringing a cliche into contact with the printing composition coating to remove a portion of the coating; and
transferring the printing composition coating remaining on the silicon-based blanket onto a printing subject.

16. The printing method of claim 15, further comprising:
drying or curing the printing composition coating transferred onto the printing subject.

17. The printing method of claim 15, wherein a pattern of the printing composition coating transferred onto the printing subject includes a pattern having a line width of 100 micrometers or less.

18. The printing method of claim 15, wherein a pattern of the printing composition coating transferred onto the printing subject includes a pattern having a line width of 7 micrometers or less.

19. The printing method of claim 15, wherein the printing composition coating transferred onto the printing subject includes a pattern having a line width of 100 micrometers or less and a pattern having a line width of 7 micrometers or less.

20. The printing method of claim 15, wherein a pattern of the printing composition coating transferred onto the printing subject has a line width change ratio of 20(%) or less represented by the following Equation 2:

$$\text{Line width change ratio (\%)} = \{(\text{size of the printing pattern} - \text{size of the cliche pattern})/(\text{size of the cliche pattern})\} \times 100. \quad [\text{Equation 2}]$$

21. The printing method of claim 15, wherein a pattern of the printing composition coating transferred onto the printing subject has an entire surface transfer ratio of 80 to 100(%) represented by the following Equation 3:

$$\text{Entire surface transfer ratio (\%)} = \{(\text{area of the printing composition transferred on the printing subject mm2})/(100 \text{ mm} \times 100 \text{ mm})\} \times 100. \quad [\text{Equation 3}]$$

* * * * *